United States Patent
Tsvetkov et al.

(10) Patent No.: US 7,300,519 B2
(45) Date of Patent: Nov. 27, 2007

(54) REDUCTION OF SUBSURFACE DAMAGE IN THE PRODUCTION OF BULK SIC CRYSTALS

(75) Inventors: Valeri F. Tsvetkov, Durham, NC (US); Adrian Powell, Cary, NC (US); Stephan Georg Mueller, Durham, NC (US)

(73) Assignee: Cree, Inc., Durham, NC (US)

( * ) Notice: Subject to any disclaimer, the term of this patent is extended or adjusted under 35 U.S.C. 154(b) by 365 days.

(21) Appl. No.: 10/990,607

(22) Filed: Nov. 17, 2004

(65) Prior Publication Data

US 2006/0102068 A1    May 18, 2006

(51) Int. Cl.
    *C30B 25/12* (2006.01)
(52) U.S. Cl. .......................... 117/97; 117/84; 117/100; 117/109
(58) Field of Classification Search ................ 117/84, 117/97, 100, 109
    See application file for complete search history.

(56) References Cited

U.S. PATENT DOCUMENTS

| | | | |
|---|---|---|---|
| 4,866,005 A | 9/1989 | Davis et al. | |
| 4,946,547 A | 8/1990 | Palmour et al. | |
| 5,200,022 A | 4/1993 | Kong et al. | |
| 6,306,675 B1 | 10/2001 | Tsong et al. | |
| 6,376,900 B1 | 4/2002 | Yamada et al. | |
| 6,600,203 B2 | 7/2003 | Takahashi et al. | |
| 6,693,022 B2 | 2/2004 | Dreybrodt et al. | |
| 2002/0059902 A1 | 5/2002 | Vodakov et al. | |

OTHER PUBLICATIONS

Sterling B. Hicks, Screw Dislocations and Charge Balance as Factors of Crystal Growth, American Mineralogist, vol. 40, pp. 139-146, 1955.
D. Chaussende et al., Vapour-Liquid-Solid Mechanism for the Growth of SiC Homoepitaxial Layers by VPE, Journal of Crystal Growth, vol. 234, pp. 63-69, 2002.

*Primary Examiner*—Felisa Hiteshew
(74) *Attorney, Agent, or Firm*—Summa, Allan & Additon, P.A.

(57) ABSTRACT

The invention is an improvement in a method of producing a high quality bulk single crystal of silicon carbide in a seeded sublimation system. The improvement includes etching the front face on each of a first and second SiC seed to a depth of greater than about 20 μm while protecting the opposite or back face on each of the first and second SiC seeds. Protection of the front faces occurs by placing the faces sufficiently close to one another to shield the back faces from being etched during etching of the respective unprotected front faces. Separation of the first and second SiC seeds occurs after the etching of the front faces is complete.

28 Claims, 1 Drawing Sheet

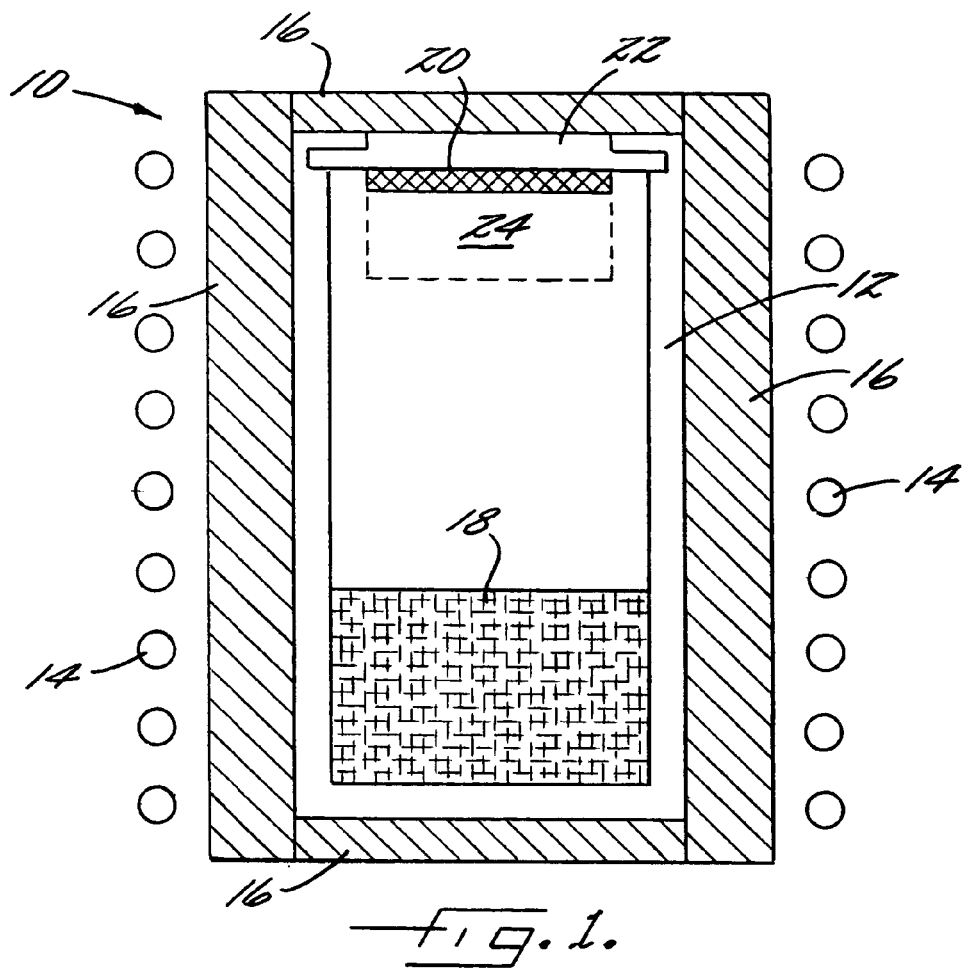
fig. 1.
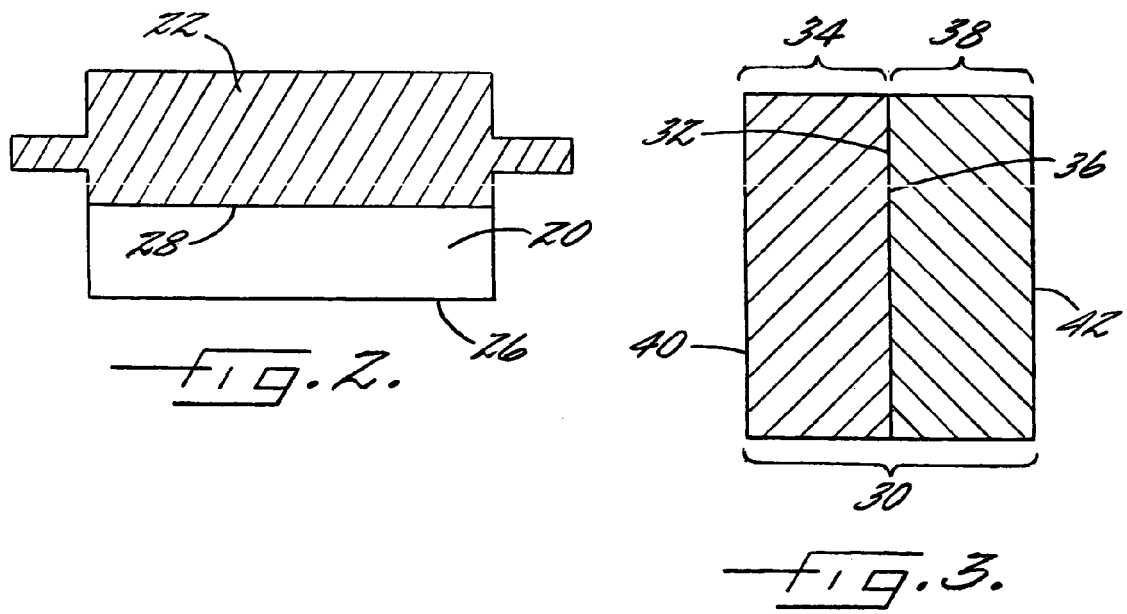
fig. 2.
fig. 3.

REDUCTION OF SUBSURFACE DAMAGE IN THE PRODUCTION OF BULK SIC CRYSTALS

BACKGROUND OF THE INVENTION

The present invention relates to the growth of silicon carbide for semiconductor purposes, and to the seeded sublimation growth of large, high quality silicon carbide single crystals. The invention particularly relates to improvements that reduce the defect density in large single crystals grown using seeded sublimation techniques.

Silicon carbide has found use as a semiconductor material for various electronic devices and purposes in recent years. Silicon carbide is especially useful due to its physical strength and high resistance to chemical attack. Silicon carbide also has excellent electronic properties, including radiation hardness, high breakdown filed, a relatively wide band gap, high saturated electron drift velocity, high temperature operation, and absorption and emission of high energy photons in the blue, violet, and ultraviolet regions of the spectrum.

Single crystal SiC is often produced by a seeded sublimation growth process. In a typical silicon carbide growth technique, a seed crystal and a source powder are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradients. The source powder is silicon carbide, as is the seed. The crucible is oriented vertically, with the source powder in the lower portions and the seed positioned at the top, typically on a seed holder; see U.S. Pat. No. 4,866,005 (reissued as No. RE34,861). These sources are exemplary, rather than limiting, descriptions of modern seeded sublimation growth techniques.

Current seeded sublimation techniques for the production of large bulk single crystals of SiC typically result in a high concentration of defects on the growing surface of the SiC crystal. High concentrations of defects cause significant problems in limiting the performance characteristics of devices made on the crystals, or substrates resulting from the crystals. For example, a typical micropipe defect density in some commercially available silicon carbide wafers can be on the order of 100 per square centimeter ($cm^{-2}$). A megawatt device formed in silicon carbide, however, requires a micropipe defect free area on the order of 0.4 $cm^{-2}$. Thus, obtaining large single crystals that can be used to fabricate large surface area devices for high-voltage, high current applications remains difficult.

Common defects found in crystals produced in the seeded sublimation production of SiC crystals include screw dislocations, particularly 1c screw dislocations. The nature and description of specific defects is generally well understood in the crystal growth art. In particular, a screw dislocation is defined as one in which the Burgers Vector is parallel to the direction vector. On an atomic scale, the resulting dislocation gives the general appearance of a spiral staircase. Other defects include threading dislocations, basal plane dislocations and micropipes. Clusters of 1c screw dislocations result in micropipes. These defects are present in crystal seeds as background defects, originating at the bottom of the seed and migrating to the surface.

More defects are introduced as a result of mechanical polishing of the surface of the crystal seed. These newly introduced defects typically reach 5-10 microns below the polished surface and are sometimes referred to as "subsurface defects." They have characteristics of 1c or threading edge or basal plane defects, but tend to loop back to the crystal surface. If these defects remain in the seed crystal, they will tend to propagate into the growing crystal under growth conditions.

The presence of subsurface defects in bulk single crystals of SiC may also interfere with single-polytype crystal growth. The 150 available polytypes of SiC raise a particular difficulty. Many of these polytypes are very similar, often separated only by small thermodynamic differences. Maintaining the desired polytype identity throughout the crystal is only one difficulty in growing SiC crystals of large sizes in a seeded sublimation system. When surface defects are present, there is not enough polytype information on the crystal surface for depositing layers to maintain the desired polytype. Polytype changes on the surface of the growing crystal result in the formation of even more surface defects.

One technique used to remove such defects is hydrogen etching of the seed wafer at temperatures of 1600° C. or greater. Hydrogen etching, however, is a difficult and expensive process, and often results in etching of the silicon face of the seed as well as the growing surface of the seed. An etched Si face is undesirable because the etching process may enlarge pits and micropipes on the Si face, or create new ones, or both. Under growth conditions, these defects may then transmit as open void spaces through the seed into the growing crystal.

Another problem with current etching technology is that the etching is only efficient to depths of about 1 μm. It is estimated that subsurface damage resulting from the crystal growth process reaches depths of at least about 5 μm, and possibly deeper than about 10 μm. If these defects are not removed, the resultant devices grown on the SiC seed will have an unacceptable defect level.

Accordingly, it would be desirable to develop a method for efficiently removing subsurface damage on the growing surface of bulk single crystals of SiC, while protecting the opposing crystal face in order to produce large, high quality bulk single crystals of SiC.

SUMMARY OF THE INVENTION

The invention is an improvement in a method of producing a high quality bulk single crystal of silicon carbide in a seeded sublimation system. In one aspect, the invention is a method of protecting a 0001 Si face of a SiC seed during a KOH etch of the 0001 C face of the SiC seed.

In another aspect, the invention is a method for efficiently removing subsurface damage on the growing surface of bulk single crystals of SiC, while protecting the opposing crystal face in order to produce large, high quality bulk single crystals of SiC.

The invention is also a SiC seed structure comprising a first 0001 Si face on a first SiC seed directly against a second 0001 Si face on a second SiC seed.

The foregoing, as well as other objectives and advantages of the invention and the manner in which the same are accomplished, is further specified within the following detailed description and its accompanying drawings.

BRIEF DESCRIPTION OF THE DRAWINGS

FIG. 1 is a cross sectional schematic diagram of a sublimation system for seeded sublimation growth;

FIG. 2 is a schematic illustration of a SiC seed prepared in accordance with the present invention and attached to a seed holder; and FIG. 3 is a schematic illustration of a SiC seed structure prepared in accordance with the present invention.

DETAILED DESCRIPTION OF THE INVENTION

The present invention relates to a method for producing high quality bulk single crystals of silicon carbide. In particular, the present invention incorporates several techniques for improving the growth of such crystals using seeded sublimation. The invention is described in terms of the sublimation growth of silicon carbide, but is not limited to silicon carbide per se.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In a first broad aspect, the invention is an improvement in a method of producing a high quality bulk single crystal of silicon carbide in a seeded sublimation system. The improvement includes etching the front face on each of a first and second SiC seed to a depth of greater than about 20 µm while protecting the opposite or back face on each of the first and second SiC faces. Protection of the back faces occurs by placing the faces sufficiently close to one another to shield the back faces from being etched during etching of the respective unprotected front faces. In preferred embodiments, the first and second back faces are placed directly against one another. Separation of the first and second SiC seeds occurs after the etching of the front faces is complete. As used herein, the front face is defined as the growing face of the crystal, and the back face is defined as the face of the crystal opposite the front face. The invention is described in terms of the 0001 Si face and the 0001 C face of the crystal for ease of discussion, but is not limited to these faces.

In another aspect, the invention is a method of producing a high quality bulk single crystal of silicon carbide in a seeded sublimation system. The method includes protecting a first 0001 Si face on a first SiC seed and a second 0001 Si face on a second SiC seed by placing them sufficiently close to one another to shield the 0001 faces from being etched during etching of the respective unprotected 0001 C faces. Next, the 0001 C faces are prepared for growth by etching a 0001 C face on each of the first and second SiC seeds to a depth of greater than about 20 µm while protecting the first and second 0001 Si faces. The method further includes separation of the first and second seeds, followed by attachment of the unetched first 0001 Si face on the first SiC seed to a seed holder. Next, SiC growth on the etched 0001 C face of the SiC seed is initiated by placing the seed holder and SiC source powder in a crucible, evacuating the crucible to remove ambient air and other impurities; placing the crucible under inert gas pressure, heating the system to SiC growth temperatures, and reducing the pressure of the system.

In another aspect, the invention is a method of producing a high quality bulk single crystal of silicon carbide in a seeded sublimation system by reducing the presence of subsurface damage, for example 1c screw dislocations at a crystal growth face. Without being bound by theory, it is believed that subsurface damage can be reduced by protecting a first 0001 Si face on a first SiC seed by placing the seeds sufficiently close to one another to shield the 0001 Si faces from being etched during etching of the respective unprotected 0001 C faces, etching a 0001 C face on each of the first and second SiC seeds to a depth sufficient to remove the 1c screw dislocations, basal plane dislocations and threading dislocations induced by the polishing process while protecting the first and second 0001 Si faces; separating the first and second SiC seeds, and thereafter initiating sublimation growth of silicon carbide on the etched 0001 C face of the SiC seed crystal.

In yet another aspect, the invention is a method for reducing the presence of subsurface damage on the growth face of a high quality bulk single crystal silicon carbide during seeded sublimation growth. The method includes protecting a first 0001 Si face on a first SiC seed and a second 0001 Si face on a second SiC seed by placing them sufficiently close to one another to shield the 0001 Si faces from being etched during etching of the respective unprotected 0001 C faces, and thereafter etching a 0001 C face on each of the first and second SiC seeds to a depth sufficient to remove subsurface damage while protecting the first and second 0001 Si faces. After etching, separation of the seeds and attachment of the unetched first 0001 Si face on the first SiC seed to a seed holder prepares the seed for sublimation growth. The second 0001 Si face on the second SiC seed may be attached to a second seed holder, thereby preparing the second SiC seed for sublimation growth.

In yet another method, the invention is a method of protecting a 0001 Si face of a SiC seed during etching. The method includes placing a first 0001 Si face on a first SiC seed sufficiently close to a second 0001 Si face on a second SiC seed to prevent etching of the first and second 0001 Si faces during a KOH etch of a first 0001 C face on the first SiC seed and a second 0001 face on the second SiC seed, and thereafter separating the unetched first and second 0001 Si faces.

The etching step is preferably a molten KOH etch. KOH etches are known in the art, however the 0001 Si face of the SiC seed is pitted by the enhanced etching rate associated with micropipes and other defects. In the present invention, protection of the 0001 Si faces of the SiC seeds during the KOH etch process results in a sufficiently etched 0001 C face on each seed and a 0001 Si face maintains its unetched condition. In a preferred embodiment, the KOH etch is conducted in a melt at a temperature of about 600° C. and is at least about 20 µm deep, more preferably greater than about 25 µm deep, and most preferably greater than about 30 µm deep. A preferred etch depth is between about 20 and 45 µm. There is no limitation to how deep the KOH etch may be, but relevant subsurface damage, such as that described in the Background section, is effectively removed at these depths, and etching beyond about 45 µm, although not harmful, is unnecessary.

Although a KOH etch is preferred, in alternative embodiment, the protected seeds may be etched in a hydrogen etch at temperatures around about 1600° C. or by a chemomechanical polish of the seed of the type that does not produce the damage described earlier.

FIG. 1 is a cross sectional schematic diagram of a sublimation system for seeded sublimation growth of the type contemplated as useful in the present invention. The system is broadly designated at 10. As in most typical systems, the system 10 includes a graphite susceptor, or crucible, 12 and a plurality of induction coils 14 that heat the susceptor 12 when current is applied through the coils 14. Alternatively, some systems incorporate resistance heating. It will be understood by those familiar with these crystal growth techniques that the system can be further enclosed in some circumstances, e.g., in a water-cooled quartz vessel. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 12 is typically surrounded by insulation 16, several portions of which are illustrated in FIG. 1. Although FIG. 1 illustrates the insulation as being generally consistent in size and placement, it will be understood and is recognized by those of skill in the art that the placement and amount of the insulation 16 can be used to provide desired thermal gradients (both axially and radially) along the susceptor 12. Again, for purposes of simplification, these possible permutations are not illustrated herein.

The susceptor 12 includes one or more portions for containing a silicon carbide powder source 18. Such a powder source 18 is most commonly—although not exclusively—used in seeded sublimation growth techniques for silicon carbide. FIG. 1 illustrates the powder source 18 as being contained in a lower portion of the susceptor 12 and this is one typical arrangement. As another familiar variation, some systems distribute the source powder in a vertical, cylindrical arrangement in which the source powder surrounds a larger portion of the interior of the susceptor 12 than does the arrangement illustrated in FIG. 1. The invention described herein can be appropriately carried out using both types of equipment.

The silicon carbide seed crystal is designated at 20, and is typically placed in upper portions of the susceptor 12. A seed holder 22 typically holds the seed 20 in place with the seed holder 22 being attached to the susceptor in an appropriate fashion. The seed 20 is typically attached to the seed holder 22 via the unetched 0001 Si face. In the orientation illustrated in FIG. 1, the upper portions of the seed holder 22 would typically be attached via attachment means known in the art to the uppermost portions of the susceptor 12 to hold the seed 20 in the desired position. The seed holder 22 is preferably a graphite seed holder.

In some embodiments it may be desirable to anneal the seed holder 22 prior to attaching the seed 20. Annealing the seed holder 22 prior to sublimation growth prevents the seed holder 22 from undergoing significant distortion during crystal growth at SiC sublimation temperatures. Annealing the seed holder 22 also minimizes or eliminates temperature differences across the seed 20 that would otherwise tend to initiate and propagate defects in the growing crystal 24. A preferred process for annealing the seed holder 22 includes annealing at temperatures at or about 2500° C. for at least about 30 minutes.

The growing crystal is illustrated by the dotted rectangle designated 24. The growing crystal 24 may have the same diameter as the seed 20 or a larger diameter than the seed 20. Preferably, the growing single crystal 24 has the same diameter as the seed 20.

The general scheme for sublimation growth is set forth briefly in the Background portion of the specification, as well as in other sources well-known to those of ordinary skill in this art. Typically, an electric current, having a frequency to which the susceptor 12 responds, is passed through the induction coils 14 to heat the graphite susceptor 12. The amount and placement of the insulation 16 are selected to create a thermal gradient between the powder source 18 and the growing crystal 24 when the susceptor 12 heats the powder source 18 to sublimation temperatures, which are typically on the order of between about 2000° C. and 2500° C. The thermal gradient is established to maintain the temperature of the seed 20 and thereafter the growing crystal 24 below temperature of silicon carbide powder to thereby thermodynamically encourage the vaporized species that are generated when silicon carbide sublimes (Si, $Si_2C$, and $SiC_2$) to condense first upon the seed crystal and thereafter upon the growing crystal. As one example, U.S. Pat. No. 4,866,005 suggests maintaining the seed at about 2300° C. Sublimation growth may also be conducted at temperatures between about 2000 and 2500° C. and may be on-axis or off-axis growth. Preferably, the sublimation growth is on-axis growth.

Preferably, the susceptor 12 is placed under gas pressure prior to initiating sublimation growth. Preferred gases include noble gases, nitrogen, CO, $H_2$, $CH_4$, other hydrocarbons known in the art, and mixtures thereof.

After reaching the desired crystal size, growth is terminated by reducing the temperature of the system to below about 1900° C. and raising the pressure to above about 400 torr.

It may be further desirable to anneal the crystal after completion of the sublimation growth process. The crystal may be annealed at temperatures above about 2500° C. for a period greater than about 30 minutes.

In some embodiments, it may be preferred to include dopant atoms in the single crystal 24. Introducing dopant gases to the seeded sublimation system incorporates dopant atoms in the single crystal 24. Dopants are selected for their acceptor or donor capabilities. Donor dopants are those which produce n-type conductivity in the crystal and acceptor dopants are those which produce p-type conductivity in the crystal. Preferred dopant atoms include donor and acceptor dopant atoms. Especially preferred donor dopants include N, P, As, Sb, Bi, and mixtures thereof. Especially preferred acceptor dopants include B, Al, Ga, In, T1, and mixtures thereof.

For purposes of clarity, the singular term, "thermal gradient," will be used herein, but it will be understood by those of skill in this art that several gradients can desirably co-exist in the susceptor 12 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed crystal 20 and then on the growing crystal 24 in the same polytype as the seed crystal 20.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch, and 100 mm diameter single crystals are preferred.

In one aspect, and as seen in FIG. 2, the invention is a SiC seed 20 with low density of 1 c screw dislocations and threading dislocations on a growing surface 26. The seed has an unetched 0001 Si face 28 and an etched 0001 C face 26 having a 1 c screw dislocation density of less than about 2000 cm$^{-2}$.

The SiC seed may be attached to a seed holder 22, preferably a graphite seed holder. The attachment may be any attachment known in the art. In one embodiment, a mechanical attachment may be preferred. Preferably, the attachment of the SiC seed to the seed holder occurs via the unetched 0001 Si face of the seed.

In yet another aspect, and as depicted in FIG. 3, the invention is a SiC seed structure, broadly designated at 30 having a first 0001 Si face 32 on a first SiC seed 34 directly against a second 0001 Si face 36 on a second SiC seed 38. The first 0001 Si face 32 is directly opposite a first 0001 C face 40 and the second 0001 Si face 36 is directly opposite a second 0001 C face 42. Preferably, any gaps between the first 0001 Si face 32 on the first SiC seed 34 and the second 0001 Si face 36 on the second SiC seed 38 are less than about 10 µm, more preferably less than about 5 µm, and most preferably less than about 2 µm.

Bulk single crystals grown in accordance with the present invention have reduced surface and subsurface damage. Preferably, the growth surface is substantially free of subsurface damage.. The growth surface of crystals grown in accordance with the present invention allows the crystal to maintain a consistent polytype throughout the crystal. Preferred polytypes include the 3C, 4H, 6H, and 15R polytypes.

EXAMPLE

In one example, two 3.25 inch polished SiC seed wafers were placed together, 0001 Si face to 0001 Si face to prevent the silicon faces from etching in a KOH melt and so keep them flat to ensure perfect thermal contact of the seed with the seed holder during crystal growth. The two seeds were placed in a KOH melt at 600° C. for 45 minutes to allow etching of the 0001 C faces on the SiC wafers. This etching removed 35 µm from the 0001 C faces. After the etch, the seeds were wafered and polished as known in the art, and the 1 c screw dislocation density in the wafer near the seed was 2000 cm$^{-2}$, which is five times lower than the typical 1 c screw dislocation density in the crystal grown on the polished seed.

In the specification and the drawings, typical embodiments of the invention have been disclosed. Specific terms have been used only in a generic and descriptive sense, and not for purposes of limitation. The scope of the invention is set forth in the following claims.

That which is claimed is:

1. A method of protecting a 0001 Si face of a SiC seed during etching, the method comprising:
   placing a first 0001 Si face on a first SiC seed sufficiently close to a second 0001 Si face on a second SiC seed to prevent etching of the first and second 0001 Si faces during a KOH etch of a first 0001 C face on the first SiC seed and a second 0001 C face on the second SiC seed; and
   thereafter separating the unetched first and second 0001 Si faces.

2. A method according to claim 1 wherein the first 0001 Si face and the second 0001 Si face are placed directly against one another prior to the KOH etch.

3. In a method of producing a high quality bulk single crystal of silicon carbide in a seeded sublimation system, an improvement comprising:
   etching a front face on each of a first and second SiC seed to a depth of greater than about 20 µm while protecting a back face on each of the first and second SiC seeds by placing the first and second back faces sufficiently close to one another to shield the back faces from being etched during etching of the respective unprotected front faces; and
   thereafter separating the first and second SiC seeds.

4. A method according to claim 3 further comprising the step of attaching an unetched back face to a seed holder.

5. A method according to claim 4 wherein the step of attaching the unetched back face to a seed holder is followed by placing the seed holder in a crucible and initiating sublimation growth on the etched front face.

6. A method according to claim 5 wherein the step of initiating sublimation growth on the etched front face comprises initiating on-axis sublimation growth.

7. A method according to claim 6 wherein the step of initiating sublimation growth comprises growing a bulk single crystal at substantially the same diameter as the seed crystal.

8. A method according to claim 3 wherein the step of protecting a first back face on a first SiC seed and a second back face on a second SiC seed by placing them close enough to one another to prevent etching of the first and second back faces comprises placing the first back face directly against the second back face.

9. A method according to claim 3 comprising etching the front face on each of the first and second SiC seeds with KOH.

10. A method according to claim 1 wherein the front face is 0001C and the back face is 0001Si.

11. A method of producing a high quality bulk single crystal of silicon carbide in a seeded sublimation system, the method comprising:
    reducing the presence of 1c screw dislocations at a crystal growth surface by protecting a first 0001 Si face on a first SiC seed and a second 0001 Si face on a second SiC seed by placing the seeds sufficiently close to one another to shield the 0001 Si faces from being etched during etching of the respective unprotected 0001 C faces;
    etching a 0001 C face on each of the first and second SiC seeds to a depth sufficient to remove subsurface damage while protecting the first and second 0001 Si faces;
    separating the first and second SiC seeds; and
    initiating sublimation growth of silicon carbide on the etched 0001 C face of the SiC seed crystal.

12. A method according to claim 11 wherein said step of etching a 0001 C face to a depth sufficient to remove subsurface damage comprises etching to a depth greater than about 20 µm.

13. A method according to claim 11 further comprising the step of attaching the unetched second 0001 Si face to a second seed holder.

14. A method according to claim 11 wherein the step of protecting a first 0001 Si face on a first SiC seed and a second 0001 Si face on a second SiC seed by placing them close enough to one another to prevent etching comprises placing the first 0001 Si face directly adjacent the second 0001 Si face.

15. A method according to claim 11 comprises etching a 0001 C face on each of the first and second SiC seeds with KOH.

16. A method according to claim 11 wherein the step of initiating sublimation growth on the etched 0001 C face comprises initiating on-axis sublimation growth.

17. A method according to claim 16 wherein the step of initiating sublimation growth comprises growing a bulk single crystal at substantially the same diameter as the seed crystal.

18. A method according to claim 11 further comprising annealing the seed holder prior to sublimation growth to prevent the seed holder from significant distortion during crystal growth at SiC sublimation temperatures and thereby minimize or eliminate temperature differences across the seed that would otherwise tend to initiate and propagate defects in the growing crystal.

19. A method for reducing the presence of subsurface damage on the growth face of a high quality bulk single crystal silicon carbide during seeded sublimation growth, the method comprising:
protecting a first 0001 Si face on a first SiC seed and a second 0001 Si face on a second SiC seed by placing them sufficiently close to one another to shield the 0001 Si faces from being etched during etching of the respective unprotected 0001 C faces;
etching a 0001 C face on each of the first and second SiC seeds to a depth sufficient to remove subsurface damage while protecting the first and second 0001 Si faces;
separating the first and second SiC seeds; and
thereafter attaching the unetched first 0001 Si face on the first SiC seed to a seed holder.

20. A method according to claim 19 wherein the step of etching a 0001 C face on each of the first and second SiC seeds to a depth sufficient to remove subsurface damage comprises etching to a depth greater than about 20 µm.

21. A method of producing a high quality bulk single crystal of silicon carbide in a seeded sublimation system, the method comprising:
protecting a first 0001 Si face on a first SiC seed and a second 0001 Si face on a second SiC seed by placing them sufficiently close to one another to shield the 0001 faces from being etched during etching of the respective unprotected 0001 C faces;
etching a 0001 C face on each of the first and second SiC seeds to a depth of greater than about 20 µm while protecting the first and second 0001 Si faces;
separating the first and second SiC seeds;
thereafter attaching the unetched first 0001 Si face on the first SiC seed to a seed holder
placing the seed holder in a crucible;
placing a SiC source powder in the crucible;
evacuating the crucible to remove ambient air and other impurities;
placing the crucible under gas pressure;
heating the system to SiC growth temperatures; and
reducing the pressure to initiate SiC growth.

22. A method according to claim 21 comprising etching the 0001 C face on each of the first and second SiC seeds with KOH.

23. A method according to claim 21 wherein the step of attaching the unetched first 0001 Si face to a seed holder comprises placing the seed on a graphite seed holder.

24. A method according to claim 21 further comprising stopping growth by raising the inert gas pressure in the crucible to above about 400 torr and lowering the temperature to below about 1900° C. to stop crystal growth.

25. A method according to claim 21 wherein the step of placing the crucible under gas pressure involves introducing a gas selected from the group consisting of noble gases, CO, $H_2$, $CH_4$, $N_2$, and mixtures thereof.

26. A method according to claim 21 wherein the step of heating the system to SiC growth temperatures involves heating to temperatures between about 1900 and 2500° C.

27. A method according to claim 21 further comprising the step of introducing dopant gases to the seeded sublimation system, thereby incorporating dopants into the SiC single crystal.

28. A method according to claim 21 further comprising annealing the crystal after the completion of the crystal growth process.

* * * * *